(12) United States Patent
Knobloch

(10) Patent No.: US 8,514,663 B2
(45) Date of Patent: Aug. 20, 2013

(54) ACOUSTIC AND MAGNETOSTRICTIVE ACTUATION

(76) Inventor: Charles Saron Knobloch, Katy, TX (US)

(*) Notice: Subject to any disclaimer, the term of this patent is extended or adjusted under 35 U.S.C. 154(b) by 540 days.

(21) Appl. No.: 11/913,502

(22) PCT Filed: May 2, 2006

(86) PCT No.: PCT/US2006/016611
§ 371 (c)(1),
(2), (4) Date: Nov. 2, 2007

(87) PCT Pub. No.: WO2006/119179
PCT Pub. Date: Nov. 9, 2006

(65) Prior Publication Data
US 2008/0192577 A1   Aug. 14, 2008

Related U.S. Application Data

(60) Provisional application No. 60/677,229, filed on May 2, 2005, provisional application No. 60/677,250, filed on May 2, 2005.

(51) Int. Cl.
*H04B 1/04* (2006.01)
(52) U.S. Cl.
USPC ............................................. 367/137
(58) Field of Classification Search
USPC .................................. 367/137, 138
See application file for complete search history.

(56) References Cited

U.S. PATENT DOCUMENTS

| | | | |
|---|---|---|---|
| 3,683,325 A * | 8/1972 | Vlahos ........................ | 367/137 |
| 3,806,862 A * | 4/1974 | Chao ......................... | 367/137 |
| 3,954,526 A | 5/1976 | Mangum et al. | |
| 4,694,905 A | 9/1987 | Armbruster | |
| 4,924,449 A * | 5/1990 | Guigne ........................ | 367/138 |
| 4,927,334 A | 5/1990 | Engdahl et al. | |
| 5,029,143 A | 7/1991 | McCracken et al. | |
| 5,114,467 A | 5/1992 | Nakamura | |
| 5,309,405 A | 5/1994 | Brett | |
| 5,465,789 A | 11/1995 | Evans | |
| 3,242,988 A | 3/1996 | Kern | |
| 5,620,049 A | 4/1997 | Gipson | |
| 5,667,861 A | 9/1997 | Harth | |
| 5,792,284 A | 8/1998 | Cedell et al. | |
| 6,074,179 A | 6/2000 | Jokela et al. | |
| 6,226,228 B1 | 5/2001 | Hossack et al. | |
| 6,243,323 B1 | 6/2001 | Li | |
| 6,279,653 B1 | 8/2001 | Wegener et al. | |

(Continued)

FOREIGN PATENT DOCUMENTS

JP    10-242543    9/1998

Primary Examiner — Ian Lobo

(57) ABSTRACT

Provided is a system for characterizing complex acoustic waves having: means to read an existing configuration file containing saved parameters or create a new configuration file with no previous parameters; means for defining an actuation carrier, selecting the wave shape, and specifying the associated parameters; means for defining the propagation control signal; means for defining the propagation control signal repeat rate; means to produce a resultant actuation signal and, optionally, output resultant actuation signal as a file; and, for multiple carriers, means to define the multiple carrier stagger and referenced actuation signal. Optionally, further provided are means to input a frequency response as a function of frequency and distance; means to define a distance; and means to produce an effective actuation signal derived from the resultant actuation signal, the frequency response, and distance.

6 Claims, 6 Drawing Sheets

(56) References Cited

U.S. PATENT DOCUMENTS

| | | |
|---|---|---|
| 6,321,845 B1 | 11/2001 | Deaton |
| 6,499,536 B1 | 12/2002 | Ellingsen |
| 6,528,157 B1 | 3/2003 | Hussain et al. |
| 6,550,534 B2 | 4/2003 | Brett |
| 6,607,036 B2 | 8/2003 | Ranson et al. |
| 6,725,930 B2 | 4/2004 | Boney et al. |
| 6,849,195 B2 | 2/2005 | Basheer et al. |
| 6,904,982 B2 | 6/2005 | Judge et al. |
| 6,959,602 B2 * | 11/2005 | Peterson et al. ............ 73/602 |
| 7,210,526 B2 | 5/2007 | Knobloch |
| 7,596,054 B2 * | 9/2009 | Kremer et al. ............ 367/137 |
| 7,644,762 B2 | 1/2010 | Knobloch |
| 2004/0195541 A1 | 10/2004 | Basheer |
| 2005/0269088 A1 | 12/2005 | Vinegar |
| 2005/0269313 A1 | 12/2005 | Vinegar |
| 2005/0274510 A1 | 12/2005 | Nguyen et al. |
| 2006/0198471 A1 * | 9/2006 | Kirkby ............ 375/343 |

\* cited by examiner

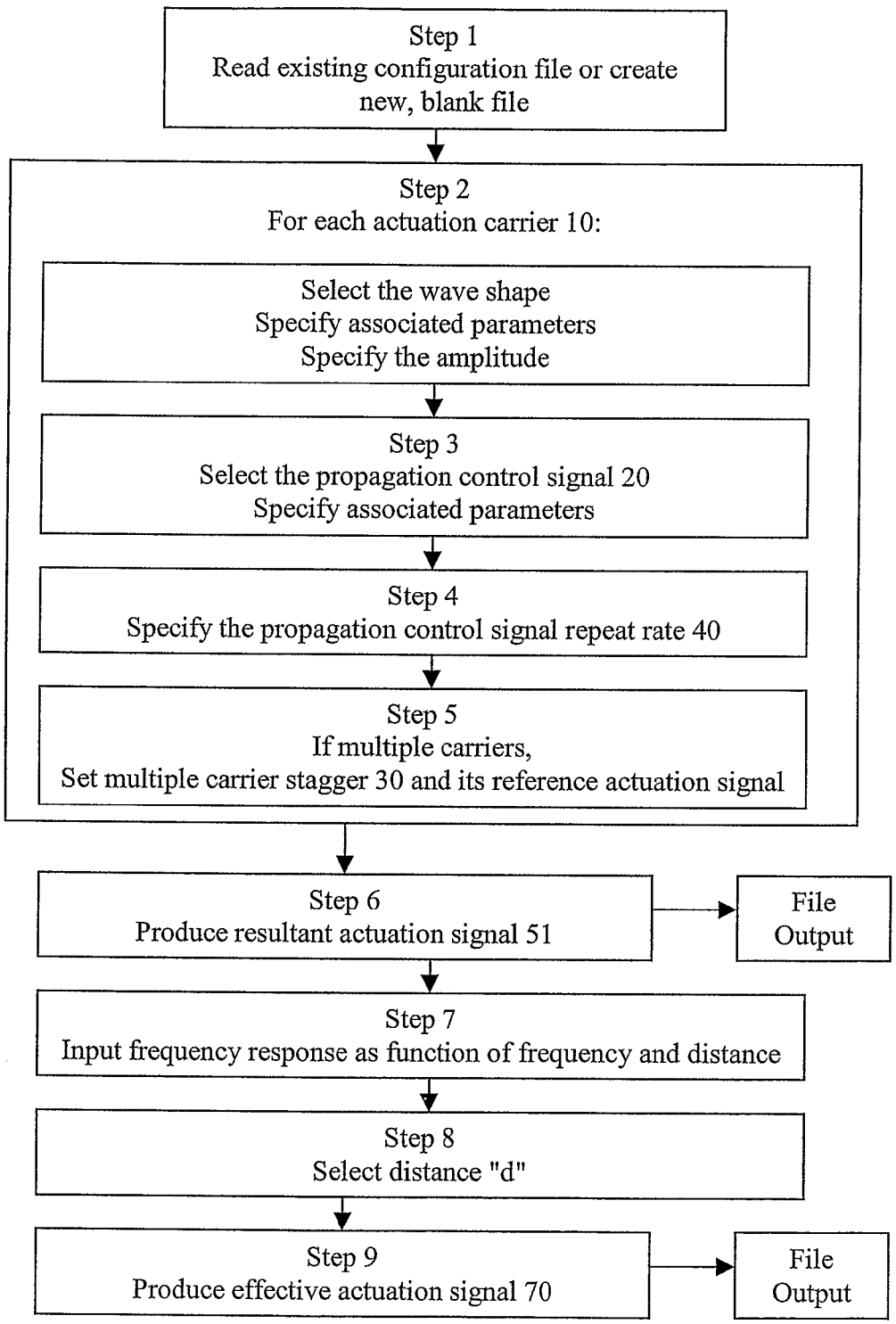

ACOUSTIC AND MAGNETOSTRICTIVE ACTUATION

CROSS REFERENCE TO RELATED APPLICATIONS

This application is the National Stage of International Application No. PCT/US2006/016611, filed May 2, 2006, which claims the benefit of U.S. Provisional Patent Application No. 60/677,229, filed May 2, 2005 and the benefit of U.S. Provisional Patent Application No. 60/677,250, filed May 2, 2005. International Application No. PCT/US2006/016761, filed May 2, 2006, further claims the benefit of U.S. Provisional Patent Application No. 60/677,229, filed May 2, 2005 and the benefit of U.S. Provisional Patent Application No. 60/677,250, filed May 2, 2005. A U.S. National Stage Application of International Application No. PCT/US2006/016761 is being filed on the same date as this application. U.S. application Ser. No. 11/278,669, filed Apr. 4, 2006, which claims the benefit of U.S. Provisional Patent Application No. 60/668,135 filed Apr. 4, 2005, has a common inventor.

FIELD OF THE INVENTION

The present invention relates generally to a method and computer program to produce an acoustic wave, particularly for acoustic and magnetostrictive actuation.

BACKGROUND TO THE INVENTION

Magnetostrictive materials, particles in particular, may be used inside a porous medium to change the porosity or permeability properties within the medium. Such materials or particles may be called magnetopropants, alluding to the effect of changing the interstitial volume by exerting force on the matrix of the medium by the change in the shape of the magnetostrictive material. To effect shape change, the magnetostrictive material must be exposed to a magnetic field. It is not always practical to supply a controllable magnetic field of sufficient strength at locations where it is desired to actuate the magnetostrictive material. For instance, it is difficult to supply a controllable magnetic field in a geologic formation at a distance far from a well bore.

Acoustic stimulation in a geologic formation has been generally limited to inducement of a selection of wave shapes, sweeps, or simply pounding of drill pipe. For example, sine waves of selected frequencies have been used to loosen the geologic formation in the immediate proximity of a well bore. Although the simple selection of wave shape and frequency may be a simple approach to acoustic stimulation, different geologic formations, hydrocarbon reservoir properties, and near-well-bore conditions create a complex set of circumstances. These complex circumstances require more sophisticated acoustic wave patterns which are characterized by more than selection of wave shape and frequency.

SUMMARY OF EXAMPLES OF THE INVENTION

What I am about to describe here is a new way to characterize complex acoustic wave shapes, greatly simplifying the process of determining the desired sophisticated acoustic wave patterns for either acoustic actuation of magnetostrictive materials or the direct acoustic stimulation of geologic formations. Additionally, sophisticated acoustic wave patterns may be used for signaling in water, including use of such wave patterns to either attract or repel various species of marine or aquatic life. In the application of sophisticated acoustic wave patterns for acoustic actuation of magnetostrictive materials, the absorption of the acoustic waves by the magnetostrictive materials may be used either to absorb acoustic energy or as an energy transfer means to the media in proximity to the magnetostrictive material.

Actuation of a magnetostrictive material, such as to create a pumping action, can be induced directly by magnetic fields, or by movement of a magnetic source in proximity to the magnetostrictive material. For example, several forms of energy can be utilized to move a magnetic source, such as an applied pressure, a pressure wave, or acoustic wave. Such energy causes movement of the magnetic source relative to the magnetostrictive material.

Such actuation can be manipulated by controlling the fluctuation and amplitude of actuation caused by the energy. The fluctuation and amplitude changes of the actuation will create a complex wave shape. Definition and control of this complex wave shape will manipulate the magnetostrictive effect of the magnetostrictive material, resulting in a desired effect, such as a pumping action caused by the actuation of the magnetostrictive material. If the actuation is caused by an applied pressure, pressure wave, or acoustic wave, then the magnetostrictive material tends to absorb energy from the wave. Thus, the magnetostrictive material and magnetic source act as an energy absorber. For example, such a combination may be used as an acoustic dampening material.

According to a first set of examples of the invention, there is provided a system for characterizing complex acoustic waves including: means for generating a first actuation carrier; means for generating a first propagation control signal; means for repeating the first propagation control signal at a repeat rate; and means for combining the first actuation carrier and the first propagation control signal at the first control signal repeat rate, whereby a first actuation signal is produced.

In a further example of the invention, the above-described system further includes: means for generating a plurality of actuation signals; means for staggering the plurality of actuation signals in time relative to each other; and means for combining the plurality of actuation signals, whereby a resultant actuation signal is produced.

In a further example of the invention, the above-described system further includes: means for converting the first actuation signal into the frequency domain, whereby a frequency domain converted first actuation signal is produced; means for convolving the frequency domain converted first actuation signal with an inverse frequency response, whereby a frequency domain convolved actuation signal is produced; and means for converting the frequency domain convolved actuation signal into the time domain, whereby an effective actuation signal is produced.

In a further example of the invention, the means for generating a first actuation carrier in the above-described system further includes selection of waveshape from a group consisting essentially of: sine wave, triangular wave, square wave, and complex wave shape.

In a further example of the invention, the means for generating a first propagation control in the above-described system further includes selection of waveshape from a group consisting essentially of: sine wave, triangular wave, square wave, and complex wave shape.

In a further example of the invention, the above-described system is used for acoustic actuation of magnetostrictive materials.

In a further example of the invention, the above-described system is used for acoustic stimulation of geologic formations.

In a further example of the invention, the above-described system is used for signaling in water.

In a further example of the invention, the above-described system is used for signaling in water for the attraction or repelling of various species of aquatic life.

According to a second set of examples of the invention, there is provided a method of generating complex acoustic wave shapes including the steps of: selecting a first actuation carrier; selecting a propagation control signal; selecting a propagation control signal repeat rate; and combining the first actuation carrier and the propagation control signal and the control signal repeat rate, whereby an actuation signal is produced.

In a further example of the invention, the above-described method further includes the steps of: selecting a second actuation carrier; selecting a second propagation control signal; selecting a second propagation control signal repeat rate; combining the second actuation carrier and the second propagation control signal and the second control signal repeat rate, whereby a second actuation signal is produced; selecting a first multiple carrier stagger; and combining the first actuation signal with the second actuation signal, offset by the first multiple carrier stagger, whereby a resultant actuation signal is produced.

According to further example of the invention, there is provided a method of generating complex acoustic wave shapes including the steps of: selecting a first actuation carrier; selecting a first propagation control signal; selecting a first propagation control signal repeat rate; combining the first actuation carrier and the first propagation control signal and the first control signal repeat rate, whereby a first actuation signal is produced; selecting a second actuation carrier; selecting a second propagation control signal; selecting a second propagation control signal repeat rate; combining the second actuation carrier and the second propagation control signal and the second control signal repeat rate, whereby a second actuation signal is produced; selecting a first multiple carrier stagger; and combining the first actuation signal with the second actuation signal, offset by the first multiple carrier stagger, whereby a third actuation signal is produced.

In a further example of the invention, the above-described method further includes the steps of: selecting a third actuation carrier; selecting a third propagation control signal; selecting a third propagation control signal repeat rate; combining the third actuation carrier and the third propagation control signal and the third control signal repeat rate, whereby a fourth actuation signal is produced; selecting a second multiple carrier stagger; and combining the third actuation signal with the fourth actuation signal, offset by the second multiple carrier stagger, whereby a resultant actuation signal is produced.

In a further example of the invention, the above-described methods further include the steps of: converting the final actuation signal into the frequency domain, whereby a frequency domain converted first actuation signal is produced; convolving the frequency domain converted first actuation signal with an inverse frequency response, whereby a frequency domain convolved actuation signal is produced; and converting the frequency domain convolved actuation signal into the time domain, whereby an effective actuation signal is produced.

According to a further example of the invention, there is provided a method of generating complex acoustic wave shapes for use in acoustic actuation of magnetostrictive materials.

According to a further example of the invention, there is provided a method of generating complex acoustic wave shapes for use in the acoustic stimulation of geologic formations.

According to a further example of the invention, there is provided a method of generating complex acoustic wave shapes for use in signaling in water.

According to a further example of the invention, there is provided a method of generating complex acoustic wave shapes for use in signaling in water for the attraction or repelling of various species of aquatic life.

According to a third set of examples of the invention, there is provided a computer program to generate an actuation signal having: one or more intermediate actuation signals, each having: an actuation carrier combined with a propagation control signal, repeating at a propagation control signal repeat rate; and each intermediate actuation signal combined, offset by a multiple carrier stagger.

According to a further example of the invention, there is provided a computer program for generating complex acoustic wave shapes for use in acoustic actuation of magnetostrictive materials.

According to a further example of the invention, there is provided a computer program for generating complex acoustic wave shapes for use in the acoustic stimulation of geologic formations.

According to a further example of the invention, there is provided a computer program for generating complex acoustic wave shapes for use in signaling in water. In a further example, the present invention may be used for signaling in water for the attraction or repelling of various species of aquatic life.

BRIEF DESCRIPTION OF THE SEVERAL DRAWINGS

The present invention and its advantages will be better understood by referring to the following detailed description and the attached drawings in which:

FIG. 6 shows a flowchart view illustrating a method for executing on a computer an example of the present invention.

REFERENCE NUMERALS IN DRAWINGS

Figure 1:
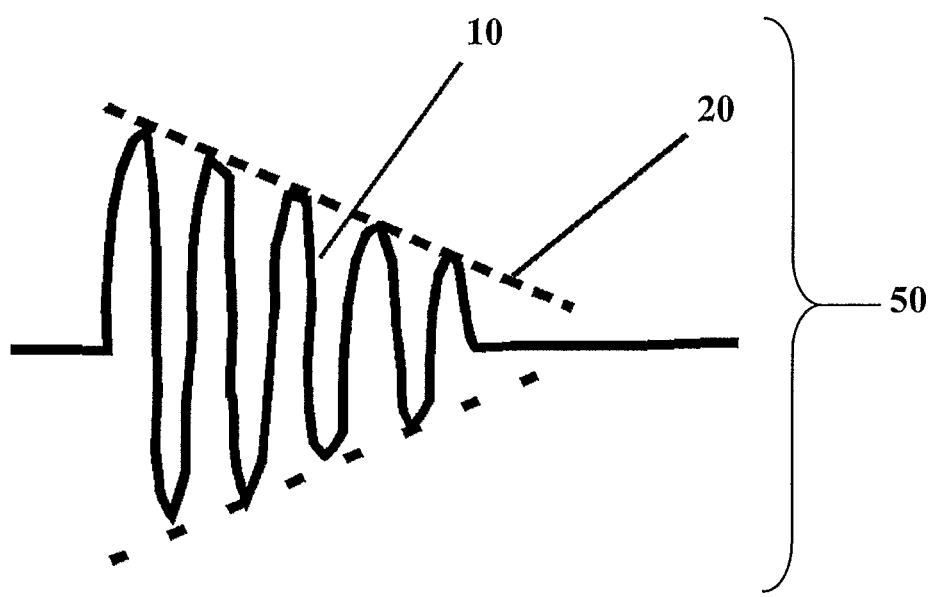
FIG. 1 shows a diagrammatic view illustrating an example of an actuation signal waveform having a single frequency actuation carrier modulated by a triangle-shaped propagation control signal.

The following elements are numbered as described in the drawings and detailed description of the invention:

| | |
|---|---|
| 10 actuation carrier | 20 propagation control signal |
| 30 multiple carrier stagger | 40 propagation control signal repeat rate |
| 50 actuation signal | |
| 51 resultant actuation signal | 60 frequency response |
| 70 effective actuation signal | |

DETAILED DESCRIPTION OF EXAMPLES OF THE INVENTION

Each of FIGS. 1-6 illustrates the method and computer program to produce various aspects of the present invention, though these particular embodiments are illustrated and described herein only for exemplary purposes. Moreover, variations of the system and methods of utilizing the same will become apparent to those of ordinary skill in the relevant structural and mechanical arts upon reading the following disclosure. Thus, the present invention is not to be considered limited to only the structures, systems, and methods described herein.

FIG. 1 shows a diagrammatic view illustrating an example of an actuation signal waveform having a single frequency actuation carrier modulated by a triangle-shaped propagation control signal. Let the actuation wave shape be called a "propagation controlled actuation signal". For convenience, this may be abbreviated to actuation signal 50, as shown in FIG. 1. In practice, actuation signal 50 may be used to define the energy signal provided to a magnetostrictive material or other purposes, such as direct acoustic stimulation or aquatic signaling.

Actuation signal 50 is comprised of one or more magnetostrictive actuation carriers, abbreviated to actuation carrier 10. In practice, actuation carrier 10 may be used to define a portion of the energy signal provided to a magnetostrictive material or other purposes, such as direct acoustic stimulation or aquatic signaling. Actuation carrier 10 may be a signal of a certain frequency, in one example, the frequency that resonates with a magnetostrictive material or aspect of the media to be actuated. Actuation carrier 10 need not be a single frequency; it may be multiple frequencies, a sweep of frequencies, or some other complex wave shape.

The amplitude of actuation carrier 10 may be varied, such as to create a modulation envelope about actuation carrier 10. For example, a triangle-shaped waveform may be used to control the amplitude of actuation carrier 10. These varied amplitudes may be called a propagation control envelope or propagation control signal 20. The modulation pattern of propagation control signal 20 may be simple, such as a triangle-shaped wave or a square-wave. The modulation pattern of propagation control signal 20 may be complex, such as a sweep pattern or other complex wave shape. FIG. 1 illustrates an example of a single frequency actuation carrier 10 modulated by a triangle-shaped propagation control signal 20. The dashed line illustrates the reduction in amplitude of the otherwise unaltered actuation carrier 10. Note here that actuation carrier 10 is shown as substantially a sine wave of constant frequency, but actually any simple or complex wave shape may be used. Note that the envelope produced by propagation control signal 20 may be any type of variation in overall amplitude, such as a square wave or some complex pattern. The combined wave created by actuation carrier 10 and propagation control signal 20 forms one cycle of actuation signal 50.

Figure 2:
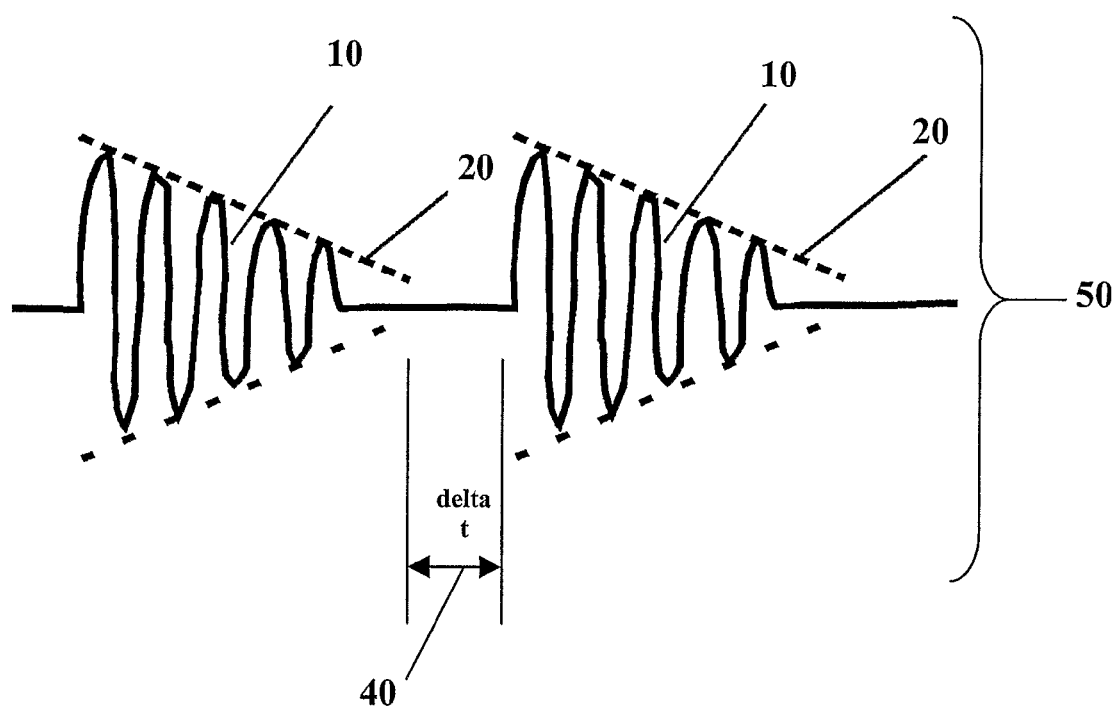
FIG. 2 shows a diagrammatic view illustrating an example of an actuation signal waveform having a repeating single frequency actuation carrier modulated by a triangle-shaped propagation control signal.

FIG. 2 shows a diagrammatic view illustrating an example of an actuation signal waveform having a repeating single frequency actuation carrier modulated by a triangle-shaped propagation control signal. Propagation control signal 20 may be repeated. If such is the case, then a delta-time may be called the control signal delay, or propagation control signal repeat rate 40, as illustrated in FIG. 2. Propagation control signal repeat rate 40 represents the amount of time to wait before repeating the modulated actuation carrier.

Figure 3:
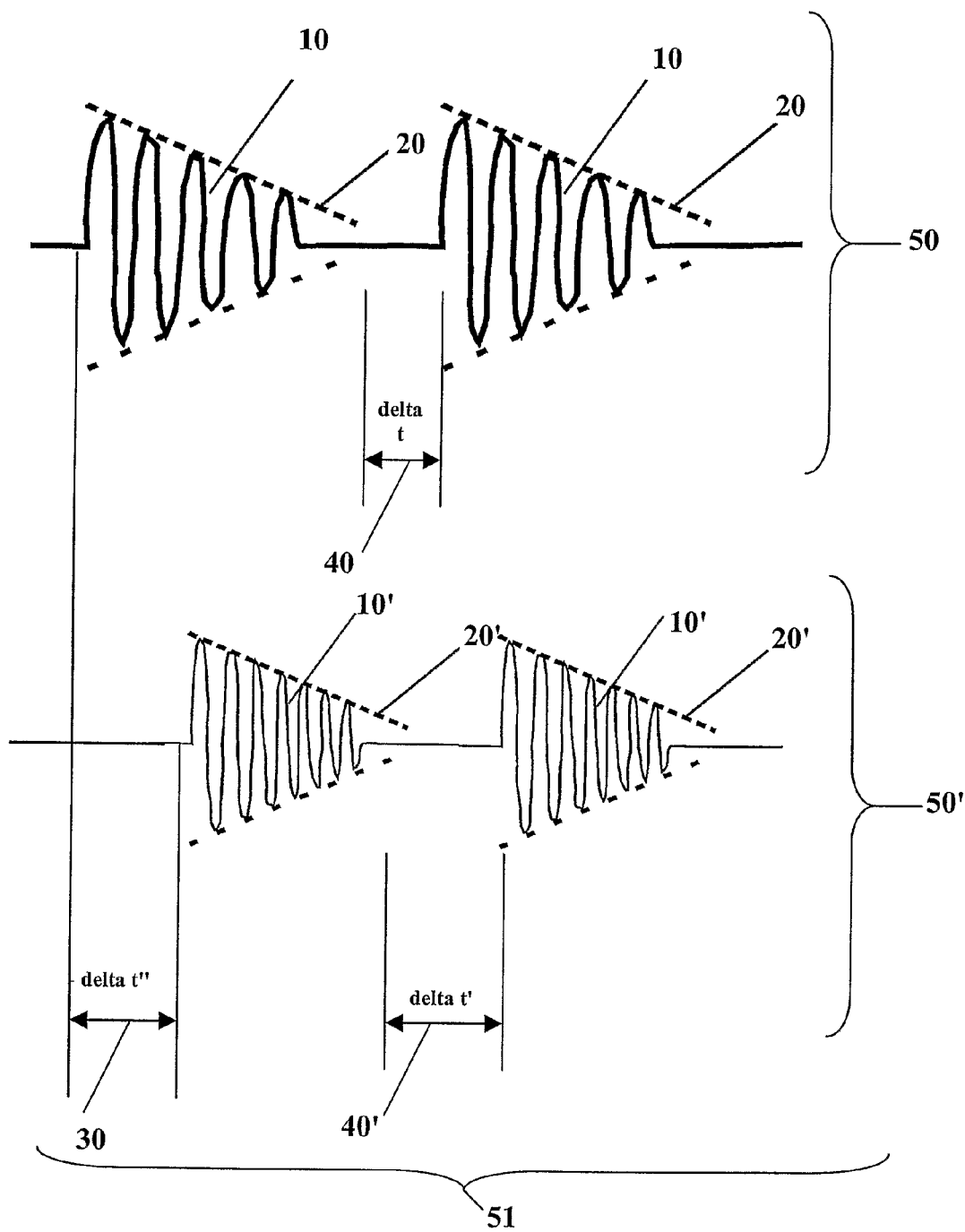
FIG. 3 shows a diagrammatic view illustrating two actuation signal waveforms delayed with respect to each other by a multiple carrier stagger.

FIG. 3 shows a diagrammatic view illustrating two actuation signal waveforms delayed with respect to each other by a multiple carrier stagger. A second, or more, actuation carriers may be introduced, each modulated by their own propagation control signal. This is illustrated in FIG. 3, where a second actuation carrier 10' is modulated by propagation control signal 20', repeating based upon propagation control signal repeat rate 40', the combination forming actuation signal 50'. As different actuation carriers may actuate different magnetostrictive materials differently, or actuate different portions of a mix of magnetostrictive material, different actuation carriers 10, 10' may be initiated at different times. A similar principle applies to direct acoustic actuation of various components of a geologic formation: the matrix, water, hydrocarbons, cementation, and near-well-bore conditions. As shown in FIG. 3, a delta time, called the multiple carrier stagger 30, represents the varied initiation time of actuation signal 50' relative to actuation signal 50.

There may be a plurality of multiple carrier staggers (30, 30', 30", et cetera, not illustrated) to indicate varied initiation times of various actuation signals. In such case, each respective multiple carrier stagger is defined relative to one other actuation signal.

The wave shape resulting from the combination of all actuation signals, with their respective multiple carrier staggers applied is a total propagation controlled actuation signal, called a resultant actuation signal 51. Resultant actuation signal 51 is the combination of all actuations signals (50, 50', etc) taking into account any multiple carrier staggers (30, 30', etc). Typically, the combination is achieved by summation and scaling the resultant actuation signal to an appropriate dynamic range that is compatible with value range of the data type used to store the resultant actuation signal.

Other complex or simple wave shapes may also be an actuation signal, such as actuation signals not requiring definition by multiple carrier stagger or propagation control signal repeat rate. However, definition by one or more parameters, such as by "carriers" (actuation carrier 10), "envelopes" (propagation control signal 20), "staggers" (multiple carrier stagger 30), or "delays" (propagation control signal repeat rate 40) provide a convenient and novel way to describe and adjust an actuation signal or resultant actuation signal.

Figure 4:
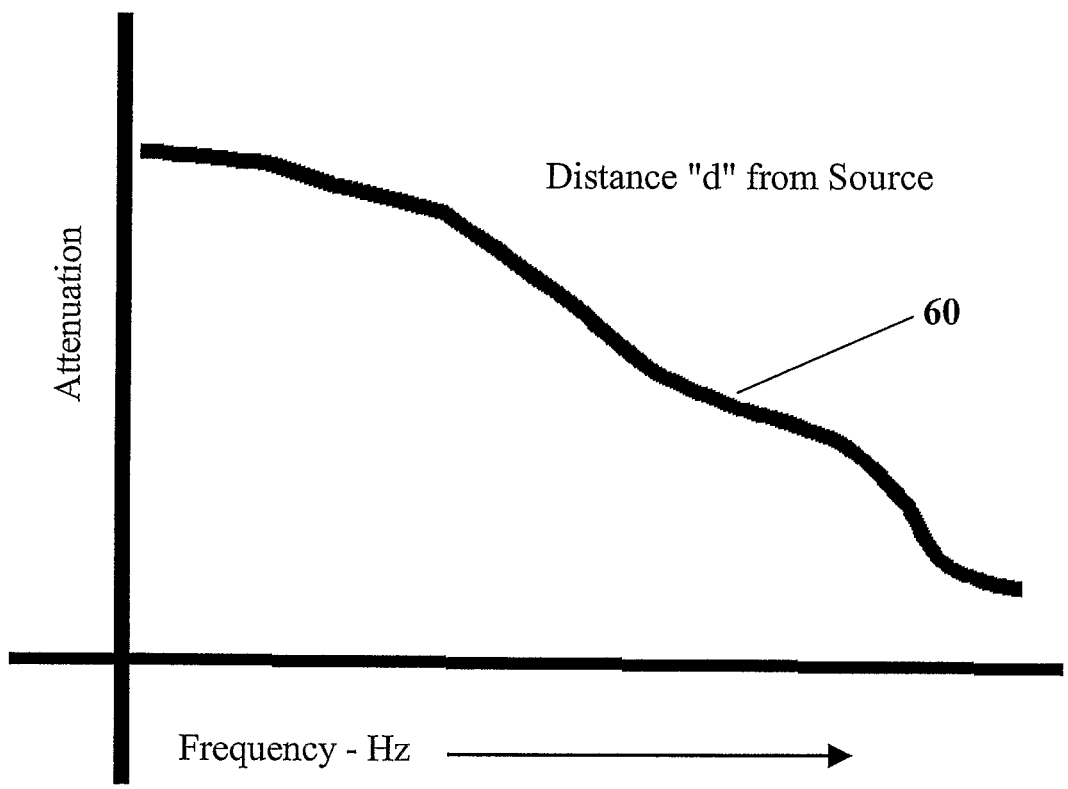
FIG. 4 shows a graphic view illustrating the frequency response of a medium for a given distance from a signal source.

FIG. 4 shows a graphic view illustrating the frequency response of a medium for a given distance from a signal source. It is known that media, such as geologic formations or those containing magnetostrictive material(s) will have a frequency dependent response to the applied energy (applied pressure, pressure wave, and acoustic source). This response may be due to frequency dependent absorption, coupling to the source, and other factors. The result is a frequency response of the medium: an acoustic absorption effect or acoustic dampening. The frequency response 60 of a medium may be illustrated graphically in FIG. 4. This attenuation usually manifests with distance from the source of energy. To compensate for this frequency response or attenuation, resultant actuation signal 51 may be converted to the frequency domain and convolved with an inverse of frequency response 60, then converted to time domain, creating an effective actuation signal 70. Such process is illustrated in the flow chart of FIG. 5.

Figure 5:
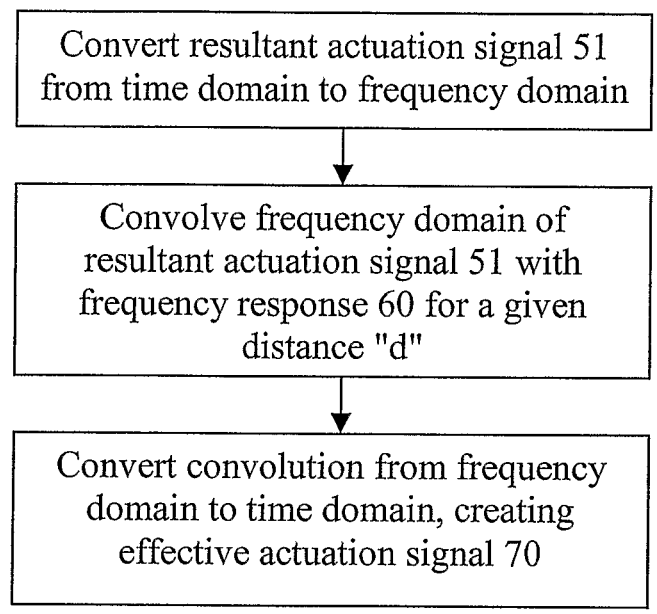
FIG. 5 shows a flowchart view illustrating the method for determining the effective actuation signal based on the frequency response of a medium.

FIG. 5 shows a flowchart view illustrating the method for determining the effective actuation signal based on the frequency response of a medium. Effective actuation signal 70 compensates for the effect of dampening or frequency response, allowing an approximate representation of resultant actuation signal 51 to present within the medium. Furthermore, since the attenuation or dampening of resultant actuation signal 51 will generally vary with distance from the source, then frequency response 60 can be used to create an effective actuation signal 70 that is particularly suited for a specific distance from the source.

By varying frequency response 60 with time, resultant actuation signal 51 may be adjusted to target various distances from the source. For example, the effective actuation signal 70 can be set to first target a distal location from the source. Later in time, frequency response 60 is then adjusted to produce an effective actuation signal 70 targeting a distance closer to the source. As time goes on, frequency response 60 is adjusted repeatedly to target distances closer and closer to the source, until the targeted distance is finally very near the source.

FIG. 6 shows a flowchart view illustrating a method for executing on a computer an example of the present invention. A computer program may be used to present a propagation control panel constructed as follows. Step 1, read an existing configuration file containing saved parameters or create a new configuration file with no previous parameters. Step 2, for each actuation carrier 10, select the wave shape (sinusoid, square wave, sweep, or complex defined shape). If necessary, specify the associated parameters, such as frequency of the sinusoid or sweep range of the sweep, as appropriate. Specify the amplitude of the actuation carrier 10. Step 3, select the propagation control signal 20 (triangle wave, square wave, or defined envelope wave shape). If necessary, specify the associated parameters, such as envelope length. Step 4, specify the propagation control signal repeat rate 40. Step 5, for multiple carriers 10, set the multiple carrier stagger 30 and select which actuation signal 50 to reference. Step 6, produce resultant actuation signal 51. Optionally, output resultant actuation signal as a file. Step 7, input the frequency response 60 as a function of frequency and distance. Step 8, select distance. Step 9, output the effective actuation signal 70 derived from resultant actuation signal 51, frequency response 60, and distance.

The present invention provides a method of generating complex acoustic wave shapes for use in acoustic actuation of magnetostrictive materials.

The present invention provides a method of generating complex acoustic wave shapes for use in the direct acoustic stimulation of geologic formations.

The present invention provides a method of generating complex acoustic wave shapes for use in signaling in water. Such method of generating complex acoustic wave shapes may be used for signaling in water for the attraction or repelling of various species of aquatic life.

The present invention provides a method of generating complex wave shapes for use in transferring energy into a medium from magnetostrictive particles and magnetic particles placed in a medium.

The present invention provides a method of generating complex wave shapes for use in the actuation of a porous media to move fluids, such as hydrocarbons, from the porous media to a collection receptacle, such as a well bore.

The present invention provides a method of generating complex wave shapes for use in direct actuation of the porous media itself.

The present invention provides a method of generating complex wave shapes for use in actuating a porous media at very low, sub-sonic frequencies.

Although the description above contains many specifications, these should not be construed as limiting the scope of the invention but as merely providing illustrations of some of the presently preferred embodiments of this present invention. Persons skilled in the art will understand that the method and apparatus described herein may be practiced, including but not limited to, the embodiments described. Further, it should be understood that the invention is not to be unduly limited to the foregoing which has been set forth for illustrative purposes. Various modifications and alternatives will be apparent to those skilled in the art without departing from the true scope of the invention, as defined in the following claims. While there has been illustrated and described particular embodiments of the present invention, it will be appreciated that numerous changes and modifications will occur to those skilled in the art, and it is intended in the appended claims to cover those changes and modifications which fall within the true spirit and scope of the present invention.

The invention claimed is:

1. A method for direct acoustic actuation of components of a geologic formation comprising:
    applying a mechanical vibrational force to the components of a geologic formation;
    wherein the mechanical vibrational force is defined by two or more first vibratory forces, each first vibratory force defined by a respective first parameter and each first vibratory force varied in amplitude to form a modulation envelope, each modulation envelope defined by a respective second parameter, repeating each modulation envelope at a rate defined by a respective third parameter, and delaying one of the two or more first vibratory forces with respect to one other of the two or more first vibratory forces by a time defined by a fourth parameter; and
    wherein the components of the geologic formation comprises:
        a magnetostrictive material; and
        a magnetic source positioned and arranged in movable proximity to the magnetostrictive material; and
        wherein the magnetostrictive material is actuated upon introduction of the mechanical vibrational force upon the magnetic source.

2. The method of claim 1 wherein the magnetostrictive material and the magnetic source are embedded in a porous medium, the magnetostrictive material and the magnetic source positioned and arranged to change the pore volume of the porous medium by exerting force on the medium upon actuation of the magnetostrictive material by the magnetic source.

3. A system for actuating a medium, comprising:
    a magnetostrictive material; and
    a magnetic source positioned and arranged in movable proximity to the magnetostrictive material;
    wherein the magnetostrictive material is actuated upon introduction of a mechanical vibrational force upon the magnetic source; and
    wherein the mechanical vibrational force is defined by two or more first vibratory forces, each first vibratory force defined by a respective first parameter and each first vibratory force varied in amplitude to form a modulation envelope, each modulation envelope defined by a respective second parameter, repeating each modulation envelope at a rate defined by a respective third parameter, and delaying one of the two or more first vibratory forces with respect to one other of the two or more first vibratory forces by a time defined by a fourth parameter.

4. The system of claim 3 wherein the magnetostrictive material and the magnetic source are embedded in a porous medium, the magnetostrictive material and the magnetic source positioned and arranged to change the pore volume of the porous medium by exerting force on the medium upon actuation of the magnetostrictive material by the magnetic source.

5. The system of claim 3 wherein the actuated medium further comprises one or more components of a geologic formation.

6. The system of claim 5 wherein the magnetostrictive material and the magnetic substance are embedded in a porous medium, the magnetostrictive material and the magnetic source positioned and arranged to change the pore volume of the porous medium by exerting force on the medium upon actuation of the magnetostrictive material by the magnetic source.

\* \* \* \* \*